United States Patent
Pyo et al.

(10) Patent No.: US 10,810,942 B2
(45) Date of Patent: Oct. 20, 2020

(54) ORGANIC LIGHT EMITTING DISPLAY DEVICE CONFIGURED TO VARY POWER SUPPLY VOLTAGE BASED ON DISPLAY BRIGHTNESS AND AMBIENT TEMPERATURE

(71) Applicant: Samsung Display Co., Ltd., Yongin-si (KR)

(72) Inventors: Si Beak Pyo, Yongin-si (KR); Choon Yul Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/205,512

(22) Filed: Nov. 30, 2018

(65) Prior Publication Data

US 2019/0304372 A1    Oct. 3, 2019

(30) Foreign Application Priority Data

Mar. 27, 2018  (KR) .................. 10-2018-0035296

(51) Int. Cl.
*G09G 3/3258* (2016.01)
*H01L 27/32* (2006.01)
(Continued)

(52) U.S. Cl.
CPC ............. *G09G 3/3258* (2013.01); *G01K 3/10* (2013.01); *H01L 27/3262* (2013.01); *H01L 27/3265* (2013.01); *G09G 3/3266* (2013.01); *G09G 3/3275* (2013.01); *G09G 2300/0809* (2013.01); *G09G 2320/0242* (2013.01); *G09G 2320/0252* (2013.01); *G09G 2330/021* (2013.01); *G09G 2330/028* (2013.01); *G09G 2360/145* (2013.01); *G09G 2360/16* (2013.01)

(58) Field of Classification Search
CPC ................................................... G09G 3/3258
USPC ............................................................ 345/82
See application file for complete search history.

(56) References Cited

U.S. PATENT DOCUMENTS 8,451,554 B2    5/2013  Kim et al.
9,013,519 B2    4/2015  Park et al.
(Continued)

FOREIGN PATENT DOCUMENTS

CN    106340267    1/2017
JP    2003-330419  11/2003
(Continued)

*Primary Examiner* — Long D Pham
(74) *Attorney, Agent, or Firm* — H.C. Park & Associates, PLC

(57) ABSTRACT

An organic light emitting display device includes a display panel, a display panel driver, and a power supply. The display panel includes pixels. Each of the pixels includes an organic light emitting diode configured to emit light in an emission period based on a first power supply voltage and a second power supply voltage. The display panel driver is configured to apply a scan signal, an emission control signal, and a data signal to the pixels. The power supply is configured to: generate the first power supply voltage, the second power supply voltage, and a third power supply voltage applied to the pixels in a non-emission period; and adjust a voltage level of the second power supply voltage and a voltage level of the third power supply voltage based on an ambient temperature and a brightness of the display panel.

19 Claims, 7 Drawing Sheets

(51) Int. Cl.
*G01K 3/10* (2006.01)
*G09G 3/3266* (2016.01)
*G09G 3/3275* (2016.01)

(56) References Cited

U.S. PATENT DOCUMENTS

| | | |
|---|---|---|
| 9,208,718 B2 | 12/2015 | Pyo |
| 9,460,662 B2 | 10/2016 | Lee et al. |
| 9,478,166 B2 | 10/2016 | Pyo et al. |
| 9,892,682 B2 | 2/2018 | Pyo |
| 9,953,573 B2 | 4/2018 | Pyo et al. |
| 2003/0214467 A1 | 11/2003 | Koyama et al. |
| 2009/0201231 A1 | 8/2009 | Takahara et al. |
| 2011/0205202 A1* | 8/2011 | Son ............... G09G 3/3208 345/207 |
| 2013/0176349 A1 | 7/2013 | Park et al. |
| 2015/0138251 A1 | 5/2015 | Pyo |
| 2015/0187277 A1* | 7/2015 | Maeyama ........ G09G 3/3291 345/694 |
| 2015/0287362 A1* | 10/2015 | Lee ............... G09G 3/3233 345/77 |
| 2016/0171929 A1* | 6/2016 | Lee ............... G09G 3/3233 345/211 |
| 2017/0011682 A1 | 1/2017 | Pyo et al. |

FOREIGN PATENT DOCUMENTS

| | | |
|---|---|---|
| KR | 10-2010-0090975 | 8/2010 |
| KR | 10-1033365 | 5/2011 |
| KR | 10-2013-0086877 | 8/2013 |
| KR | 10-2015-0056940 | 5/2015 |
| KR | 10-2015-0116070 | 10/2015 |
| KR | 10-2016-0148128 | 12/2016 |
| TW | 201329954 | 7/2013 |

\* cited by examiner

ORGANIC LIGHT EMITTING DISPLAY DEVICE CONFIGURED TO VARY POWER SUPPLY VOLTAGE BASED ON DISPLAY BRIGHTNESS AND AMBIENT TEMPERATURE

CROSS-REFERENCE TO RELATED APPLICATION

This application claims priority from and the benefit of Korean Patent Application No. 10-2018-0035296, filed Mar. 27, 2018, which is hereby incorporated by reference for all purposes as if fully set forth herein.

BACKGROUND

Field

Exemplary embodiments generally relate to display devices, and more particularly, to organic light emitting display devices capable of controlling a magnitude of a power supply voltage.

Discussion

An organic light emitting display device includes a plurality of pixels for displaying an image using organic light emitting diodes. Each of the organic light emitting diodes typically includes an anode, a cathode, and an organic light emitting layer between the anode and the cathode. The organic light emitting diode emits light when a voltage greater than a threshold voltage of the organic light emitting layer is applied between the anode and the cathode. It is noted that one or more pixels among the plurality of pixels may have different light emitting efficiency, response speed, and the like, depending on the color of emission light. In addition, the pixel characteristics of an individual pixel including the organic light emitting diode may vary depending on ambient temperature and brightness change. Due to such deviations between pixels, visibility defects, such as color blurring and color shift, can occur during frame to frame image conversion.

The above information disclosed in this section is only for understanding the background of the inventive concepts, and, therefore, may contain information that does not form prior art.

SUMMARY

Some exemplary embodiments provide an organic light emitting display device capable of controlling voltage levels of power supply voltages applied to pixels based on a brightness change and/or an ambient temperature change.

Additional aspects will be set forth in the detailed description which follows, and, in part, will be apparent from the disclosure, or may be learned by practice of the inventive concepts.

According to some exemplary embodiments, an organic light emitting display device includes a display panel, a display panel driver, and a power supply. The display panel includes pixels. Each of the pixels includes an organic light emitting diode configured to emit light in an emission period based on a first power supply voltage and a second power supply voltage. The display panel driver is configured to apply a scan signal, an emission control signal, and a data signal to the pixels. The power supply is configured to: generate the first power supply voltage, the second power supply voltage, and a third power supply voltage applied to the pixels in a non-emission period; and adjust a voltage level of the second power supply voltage and a voltage level of the third power supply voltage based on an ambient temperature and a brightness of the display panel.

In some exemplary embodiments, the power supply may include a second power supply voltage determiner, a delta voltage determiner, and a third power supply voltage determiner. The second power supply voltage determiner may be configured to determine the voltage level of the second power supply voltage based on the ambient temperature and the brightness. The delta voltage determiner may be configured to determine a delta voltage that is an offset of the second power supply voltage based on the ambient temperature and the brightness. The third power supply voltage determiner may be configured to determine the voltage level of the third power supply voltage based on the second power supply voltage and the delta voltage.

In some exemplary embodiments, the third power supply voltage may be determined as a sum of the second power supply voltage and the delta voltage.

In some exemplary embodiments, at a same ambient temperature condition, the delta voltage may decrease as the brightness increases.

In some exemplary embodiments, at a same brightness condition, the delta voltage may decrease as the ambient temperature increases.

In some exemplary embodiments, the third power supply voltage may be provided to an anode of the organic light emitting diode during the non-emission period to initialize an anode voltage of the organic light emitting diode.

In some exemplary embodiments, each of the pixels may further include a driving transistor coupled between a first node and a second node. The driving transistor may include a gate electrode coupled to a third node. The power supply may be configured to generate a fourth power supply voltage applied to the gate electrode of the driving transistor.

In some exemplary embodiments, the fourth power supply voltage may have a constant value regardless of the ambient temperature and the brightness.

In some exemplary embodiments, a (j, k) pixel arranged in a j-th column and a k-th row of the pixels may further include first to sixth transistors and a storage capacitor. The first transistor may be coupled between a j-th data line and the first node. The first transistor may include a gate electrode configured to receive a k-th scan signal. The second transistor may be coupled between the second node and the third node. The second transistor may include a gate electrode configured to receive the k-th scan signal. The third transistor may be coupled between a conductive line configured to transmit the fourth power supply voltage and the third node. The third transistor may include a gate electrode configured to receive a (k−1)-th scan signal. The fourth transistor may be coupled between a power supply line configured to transmit the first power supply voltage and the first node. The fourth transistor may include a gate electrode configured to receive a k-th emission control signal. The fifth transistor may be coupled between the second node and an anode of the organic light emitting diode. The fifth transistor may include a gate electrode configured to receive the k-th emission control signal. The sixth transistor may be coupled between a conductive line configured to transmit the third power supply voltage and the anode of the organic light emitting diode. The sixth transistor may include a gate electrode configured to receive the k-th scan signal. The storage capacitor may be coupled between the power supply line and the third node.

In some exemplary embodiments, the organic light emitting display device may further include a brightness calculator and a temperature sensor. The brightness calculator may be configured to determine the brightness of the display panel based on image data of one frame.

The temperature sensor may be configured to detect the ambient temperature of the display panel.

In some exemplary embodiments, at a same ambient temperature condition, the third power supply voltage may decrease to predetermined values as the brightness increases.

In some exemplary embodiments, at a same brightness condition, the third power supply voltage may increase to predetermined values as the ambient temperature increases.

In some exemplary embodiments, at a same ambient temperature condition, a delta voltage, which is a voltage difference between the second power supply voltage and the third power supply voltage, may increase as the brightness decreases.

In some exemplary embodiments, at a same brightness condition, the delta voltage may increase as the ambient temperature decreases.

In some exemplary embodiments, a change rate of the second power supply voltage and a change rate of the third power supply voltage may be different from each other in accordance with at least one of a change of the ambient temperature and a change of the brightness.

According to some exemplary embodiments, an organic light emitting display device includes a display panel, a display panel driver, and a power supply. The display panel includes pixels. Each of the pixels includes a driving transistor and an organic light emitting diode. The driving transistor includes a gate electrode. The organic light emitting diode is configured to emit light in an emission period based on a first power supply voltage and a second power supply voltage. The display panel driver is configured to apply a scan signal, an emission control signal, and a data signal to the pixels. The power supply is configured to: generate the first power supply voltage, the second power supply voltage, a third power supply voltage applied to the pixels in a non-emission period, and a fourth power supply voltage applied to the gate electrode of the driving transistor in the non-emission period; and adjust a delta voltage based on an ambient temperature and a brightness of the display panel. The delta voltage is a voltage difference between the second power supply voltage and the third power supply voltage.

In some exemplary embodiments, at a same ambient temperature condition, the delta voltage may decrease as the brightness increases.

In some exemplary embodiments, at a same brightness condition, the delta voltage may decrease as the ambient temperature increases.

In some exemplary embodiments, the fourth power supply voltage may have a constant value regardless of the ambient temperature and the brightness.

In some exemplary embodiments, a change rate of the second power supply voltage and a change rate of the third power supply voltage may be different from each other in accordance with at least one of a change of the ambient temperature and a change of the brightness.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
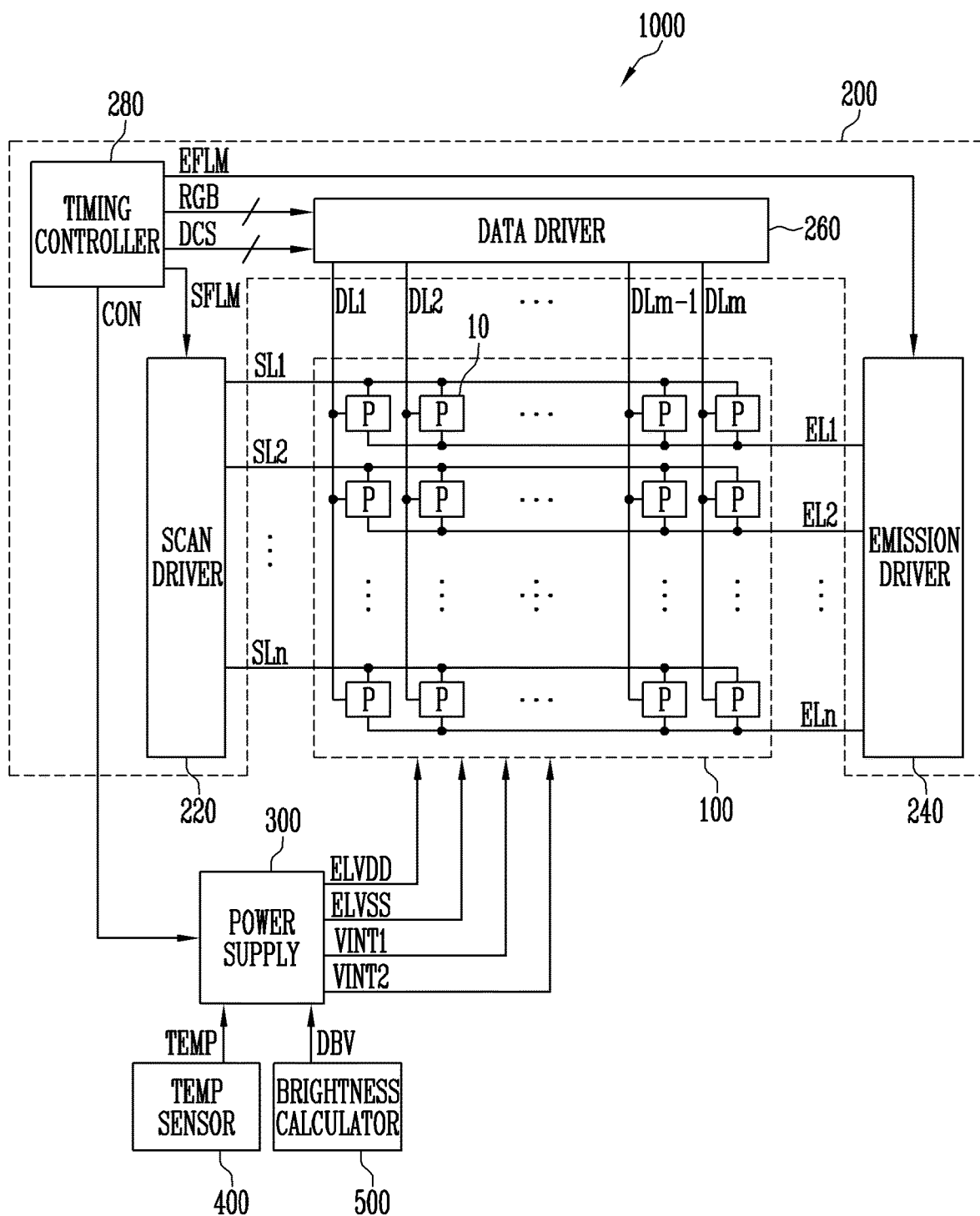
FIG. 1 is a block diagram of an organic light emitting display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

In the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts Although various exemplary embodiments are described with respect to organic light emitting display devices, it is contemplated that various exemplary embodiments are also applicable to display devices in general, such as, for example, liquid crystal displays (LCDs), inorganic electroluminescent displays (ELDs), plasma displays (PDs), field emission displays (FEDs), electrophoretic displays (EPDs), electrowetting displays (EWDs), and the like.

Exemplary embodiments will be described more fully hereinafter with reference to the accompanying drawings, in which various exemplary embodiments are shown.

FIG. 1 is a block diagram of an organic light emitting display device according to some exemplary embodiments.

Referring to FIG. 1, the organic light emitting display device 1000 may include a display panel 100, a display panel driver 200, and a power supply 300. The organic light emitting display device 1000 may further include a brightness calculator 500 and a temperature (or temp) sensor 400.

The organic light emitting display device 1000 may be a flat display device, a flexible display device, a curved display device, a foldable display device, a bendable display device, and/or the like. Further, the organic light emitting display device 1000 may be applied to a transparent display device, a head-mounted display device, a wearable display device, a single-sided display device, a dual-sided display device, and/or the like.

The display panel 100 may include a plurality of scan lines SL1 to SLn, a plurality of emission control lines EL1 to ELn, a plurality of data lines DL1 to DLm, and a plurality of pixels 10 connected to the scan lines SL1 to SLn, the emission control lines EL1 to ELn, and the data lines DL1 to DLm, respectively, where "n" and "m" are integers greater than one (1). In various exemplary embodiments, "n" and "m" may be equal to one another or different from one another. As will become more apparent below, each of the pixels 10 may include a driving transistor and a plurality of switching transistors. Each of the pixels 10 may include an organic light emitting diode that emits light in an emission period based on a first power supply voltage ELVDD and a second power supply voltage ELVSS in an emission period.

The display panel driver 200 may provide a scan signal, an emission control signal, and a data signal to the pixels 10. The display panel driver 200 may include a scan driver 220 for supplying the scan signal, an emission driver 240 for supplying the emission control signal, a data driver 260 for supplying the data signal, and a timing controller 280 for controlling the scan driver 220, the emission driver 240, and the data driver 260. The scan driver 220, the emission driver 240, the data driver 260, and the timing controller 280 may be implemented as one or more integrated circuits (ICs); however, exemplary embodiments are not limited thereto.

The scan driver 220 may provide the scan signal to the scan lines SL1 to SLn based on a scan start signal SFLM. In some exemplary embodiments, the scan driver 220 may simultaneously provide the scan signal (e.g., the scan signals having an active level or a turn-on level) to all of the pixels 10, or may sequentially provide the scan signal to the display panel 100 through the scan lines SL1 to SLn, such as in a row-by-row fashion.

The emission driver 240 may provide the emission control signal to the emission control lines EL1 to ELn based on an emission control start signal EFLM. In some exemplary embodiments, the emission driver 240 may simultaneously provide the light emission control signals to all of the pixels 10, or may sequentially provide the light emission control signal to the display panel 100 through the emission control lines EL1 to ELn.

The data driver 260 may provide the data signal (e.g., data voltages) to the data lines DL1 to DLm based on a data control signal DCS and image data RGB provided from the timing controller 280. For example, the data driver 260 may convert the image data RGB of a digital format into data signals of an analog format, and may output the data signals to the pixels 10 through the data lines DL1 to DLm.

The timing controller 280 may receive an RGB image signal, a vertical synchronizing signal, a horizontal synchronizing signal, a main clock signal, and a data enable signal from an external graphic controller or any other suitable source. The timing controller 280 may generate the scan start signal SFLM, the emission control start signal EFLM, the data control signal DCS, and the image data RGB corresponding to the RGB image signal. Further, timing controller 280 may generate a control signal CON for controlling an operation of the power supply 300.

The power supply 300 may generate the first power supply voltage ELVDD, the second power supply voltage ELVSS, and a third power supply voltage VINT1 based on the control signal CON. In some exemplary embodiments, the first power supply voltage ELVDD may be a driving voltage supplied to one electrode of the driving transistor of the pixel 10, and the second power supply voltage ELVSS may be a common voltage supplied to a cathode of the organic light emitting diode.

The third power supply voltage VINT1 may be supplied to the pixels 10 during a non-emission period. In some exemplary embodiments, the third power supply voltage VINT1 may be an initialization voltage for initializing (or resetting) an anode voltage of the organic light emitting diode to a predetermined value. Therefore, a predetermined bias may be applied to the organic light emitting diode by applying the third power supply voltage VINT1 and the second power supply voltage ELVSS to both ends of the organic light emitting diode during the non-emission period. The non-emission period may correspond to a period in which the organic light emitting diode does not emit light because the emission control signal is not applied.

In some exemplary embodiments, the power supply 300 may further generate a fourth power supply voltage VINT2 and supply the fourth power supply voltage VINT2 to the pixels 10. The fourth power supply voltage VINT2 may be provided to a gate electrode of the driving transistor to initialize a gate voltage of the driving transistor.

The power supply 300 may control a voltage level of the second power supply voltage ELVSS and a voltage level of the third power supply voltage VINT1 based on an ambient temperature TEMP of the organic light emitting display device 1000 and a display brightness DBV of the display panel 100 (e.g., display brightness value). Therefore, a forward bias can be set to a value (e.g., an optimal value) for the organic light emitting diode according to a temperature, a temperature change, a brightness, and/or a brightness change. The fourth power supply voltage VINT2 may have a constant value regardless of the brightness DBV, the change of the brightness DBV, the ambient temperature TEMP, and/or the change of the ambient temperature TEMP. When the fourth power supply voltage VINT2 varies, a driving current flowing through the driving transistor may change unexpectedly. Thereby, there is a possibility that an emission characteristic (e.g., an optical characteristic) of the pixel 10 is changed not to match the data voltage. Accordingly, the four power supply voltages VINT2 may have the constant value regardless of the brightness DBV and the ambient temperature TEMP and/or changes in the brightness DBV and the ambient temperature TEMP. For descriptive convenience, exemplary embodiments will, hereinafter, be described in association with changes in at least one of the brightness DBV and the ambient temperature TEMP.

A conventional power supply adjusts the voltage level of the second power supply voltage ELVSS in response to the brightness DBV change of the display panel 100. In this manner, when the brightness DBV changes from black to white or when a low grayscale image changes to a high grayscale image, issues with color blurring and/or color shifting due to differences in driving currents and response speeds of, for instance, red, green, and blue pixels can be addressed.

Meanwhile, the conventional power supply controls a magnitude of the third power supply voltage VINT1 according to the change of the second power supply voltage ELVSS, thereby applying a stable forward bias to the organic light emitting diode in response to the change in brightness DBV. However, the conventional power supply voltage control method does not consider the change in characteristics of the pixels 10 according to the change in ambient temperature TEMP, and thus, issues with the color shift due to temperature changes and/or increases in brightness (luminance) of low grayscale images (e.g., a black image) occur.

For example, when the forward bias of the organic light emitting diode is increased to a predetermined value or more, the response speed can be increased and the color shift can be eliminated. However, in this situation, the brightness of the low grayscale (or black brightness) may increase, which can be create an issue in implementing the low grayscale image. For example, a voltage difference between the third power supply voltage VINT1 and the second power supply voltage ELVSS may become larger than a threshold voltage of the organic light emitting diode so that the black brightness (brightness of the black image) may be increased.

In addition, when the third power supply voltage VINT1 is set in consideration of prevention of the brightness increase of the low grayscale (black brightness) image, a reverse bias may be unintentionally applied to the organic light emitting diode at a predetermined temperature and brightness condition. When the reverse bias is applied to the organic light emitting diode, the response speed deviation between, for instance, the red, green, and blue pixels becomes large, and display failure, such as a color shift, may be expressed.

Accordingly, the power supply 300 according to various exemplary embodiments may control the second power supply voltage ELVSS and the third power supply voltage VINT1 differently depending on the brightness DBV and the ambient temperature TEMP. It is possible to apply an optimal (or maximum) forward bias to the organic light emitting diode while eliminating the brightness rise of the low grayscale image (e.g., realize a stable black image brightness). Therefore, the color blurring and color shift due to a sudden change in brightness DBV may be eliminated without consuming a large amount of power.

However, in some exemplary embodiments, the second power supply voltage ELVSS and the third power supply voltage VINT1 may be adjusted such that the voltage difference between the second power supply voltage ELVSS and the third power supply voltage VINT1 is constant in accordance with the brightness DBV and the ambient temperature TEMP change.

The configuration and operation of the power supply 300 for controlling the voltage level of the second power supply voltage ELVSS and the third power supply voltage VINT1 will be described in detail with reference to FIGS. 3 to 8B.

In some exemplary embodiments, the functions of the power supply 300 and the display driver 200 are arbitrarily divided for convenience of explanation. However, configurations and operations are not limited thereto. For example, the power supply 300 may be included in the display panel driver 200, or a part of the power supply 300 may be included in the display panel driver 200.

The temperature sensor 400 may detect the ambient temperature TEMP of the display panel 100. The brightness calculator 500 may calculate (or determine) the brightness DBV of the display panel 100 based on the image data RGB of one frame. The ambient temperature TEMP and the brightness DBV generated by the temperature sensor 400 and the brightness calculator 500 may be provided to the power supply 300. In some exemplary embodiments, the ambient temperature TEMP and the brightness DBV may also be provided to the timing controller 280.

Figure 2:
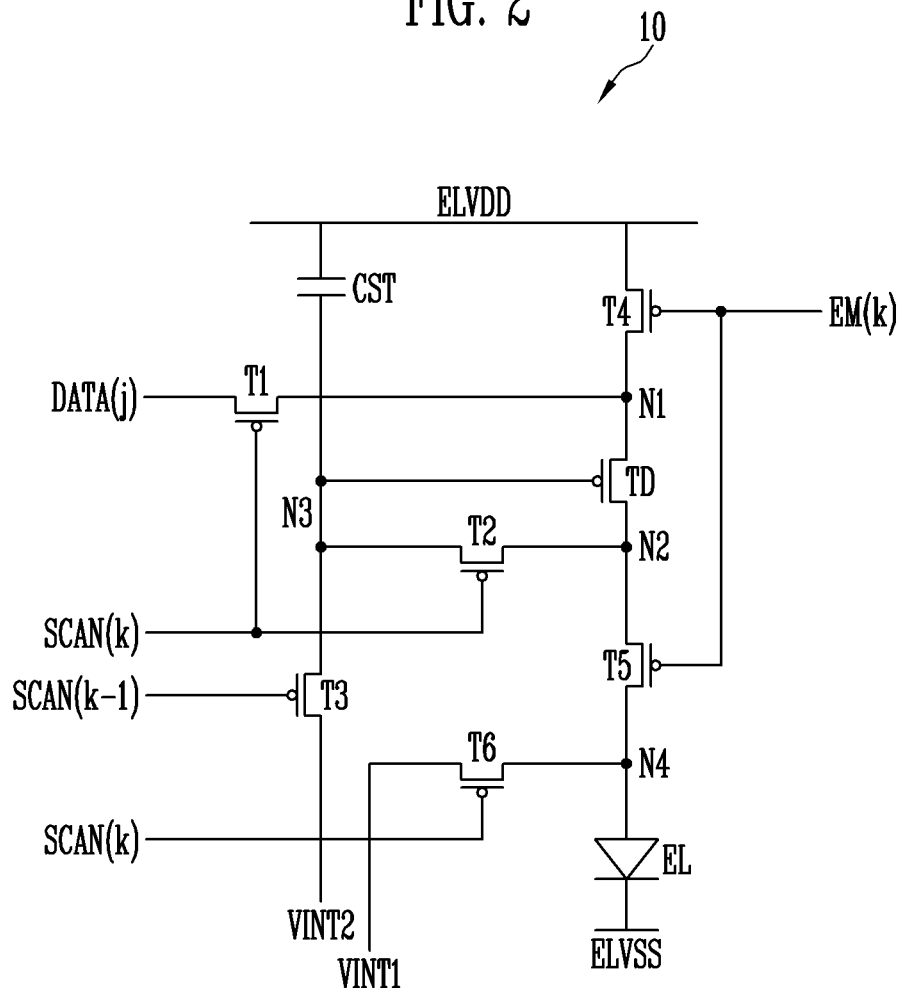
FIG. 2 is a circuit diagram illustrating an example of a pixel included in the organic light emitting display device of FIG. 1 according to some exemplary embodiments.

FIG. 2 is a circuit diagram illustrating an example of a pixel included in the organic light emitting display device of FIG. 1 according to some exemplary embodiments.

Referring to FIG. 2, the pixel 10 may include a driving transistor TD, first to sixth transistors T1 to T6, an organic light emitting diode EL, and a storage capacitor CST. The pixel 10 may be a (j, k) pixel arranged in a j-th column and a k-th row, where "j" is an integer greater than zero (0) and less than or equal to "m," and "k" is an integer greater than one (1) and less than or equal to "n."

The driving transistor TD may be coupled between a first node N1 and a second node N2. The driving transistor TD may include a gate electrode coupled to a third node N3.

The first transistor T1 may be a scan transistor for transmitting the data voltage DATA(j) to the pixel 10 by scanning a k-th scan signal SCAN(k). The first transistor T1 may be coupled between a j-th data line and the first node N1. The first transistor T1 may include a gate electrode for receiving the k-th scan signal SCAN(k).

The second transistor T2 may serve to write the data voltage DATA(j) to the driving transistor TD and to perform threshold voltage compensation. The second transistor T2 may be coupled between the second node N2 and the third node N3. The second transistor T2 may include a gate electrode for receiving the k-th scan signal SCAN(k). When the first transistor T1 and the second transistor T2 are turned on by the k-th scan signal SCAN(k), the driving transistor TD may be diode-connected and the threshold voltage compensation for the driving transistor TD may be performed.

The third transistor T3 may be coupled between the third node N3 and a conductive line transmitting the fourth power supply voltage VINT2. The third transistor T3 may include a gate electrode for receiving a (k−1)-th scan signal SCAN (k−1). When the third transistor T3 is turned on by the (k−1)-th scan signal SCAN(k−1), the fourth power supply voltage VINT2 may be supplied to the gate electrode of the driving transistor TD. For example, the fourth power supply voltage VINT2 may be an initialization voltage for initializing the gate voltage of the driving transistor TD. Thus, the gate voltage of the driving transistor TD may be initialized to the fourth power supply voltage VINT2.

In some exemplary embodiments, the fourth power supply voltage VINT2 may have a constant value regardless of changes in ambient temperature TEMP and brightness DBV of the display panel 100. In other words, the fourth power supply voltage VINT2 and the third power supply voltage VINT1 may be independently controlled. The fourth power supply voltage VINT2 may be set to a voltage lower than the lowest voltage of the data voltage.

The fourth transistor T4 may be coupled between the first node N1 and a power supply line for transmitting the first power supply voltage ELVDD. The fourth transistor T4 may include a gate electrode for receiving a k-th emission control signal EM(k).

The fifth transistor T5 may be coupled between the second node N2 and an anode N4 of the organic light emitting diode EL. The fifth transistor T5 may include a gate electrode for receiving the k-th emission control signal EM(k).

The sixth transistor T6 may be coupled between the conductive line for transmitting the third power supply voltage VINT1 and the anode N4 of the organic light emitting diode EL. The sixth transistor T6 may include a gate electrode for receiving the k-th scan signal SCAN(k). When the sixth transistor T6 is turned on by the k-th scan signal SCAN(k), the third power supply voltage VINT1 may be supplied to the anode N4 of the organic light emitting diode EL. For example, the third power supply voltage VINT1 may be an initialization voltage for initializing the anode voltage of the organic light emitting diode EL. Accordingly, the anode voltage of the organic light emitting diode EL may be initialized to the third power supply voltage VINT1 (or a difference between the third power supply voltage VINT1 and the second power supply voltage ELVSS).

In some exemplary embodiments, the third power supply voltage VINT1 may vary depending on the ambient temperature TEMP and brightness DBV of the display panel 100. For example, a change rate of the voltage level of the third power supply voltage VINT1 may be different from a change rate of the second power supply voltage ELVSS. Therefore, the magnitude of the forward bias applied to the organic light emitting diode EL may be changed according to the change in ambient temperature TEMP and/or brightness DBV of the display panel 100.

The storage capacitor CST may be coupled between the power supply line transmitting the first power supply voltage ELVDD and the third node N3.

The cathode of the organic light emitting diode EL may be connected to the power supply line transmitting the second power supply voltage ELVSS. The second power supply voltage ELVSS may vary depending on the change in ambient temperature TEMP and/or the change in brightness DBV of the display panel 100.

Figure 3:
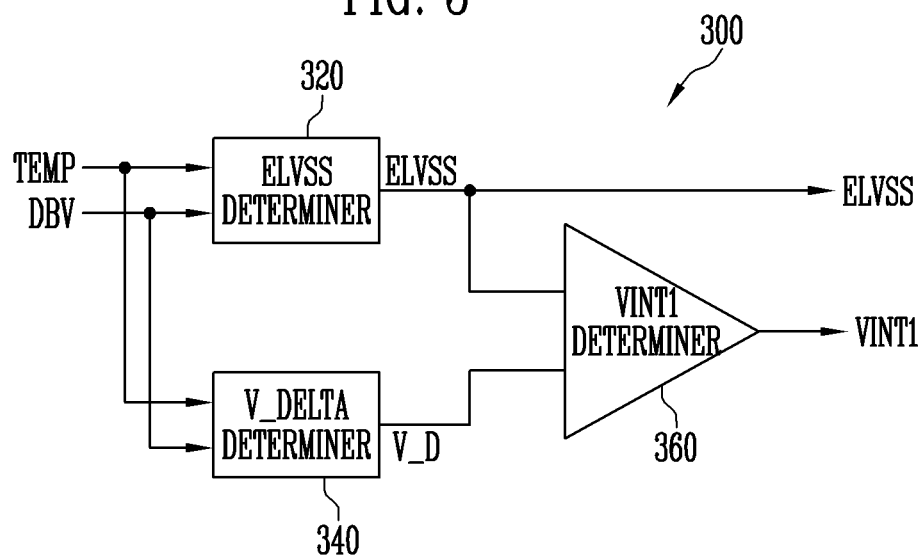
FIG. 3 is a block diagram illustrating an example of a power supply included in the organic light emitting display device of FIG. 1 according to some exemplary embodiments.
Figure 4:
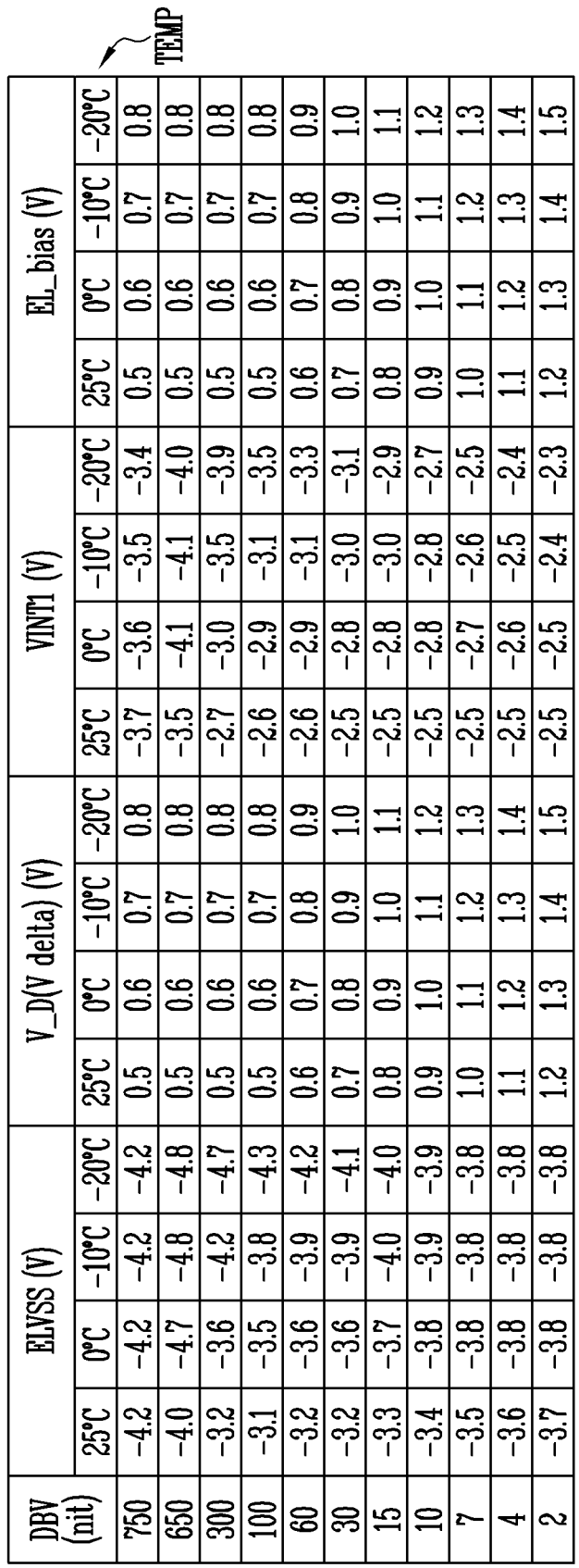
FIG. 4 is a diagram illustrating an example of power supply voltages output from the power supply of FIG. 3 according to some exemplary embodiments.

FIG. 3 is a block diagram illustrating an example of a power supply included in the organic light emitting display device of FIG. 1 according to some exemplary embodiments. FIG. 4 is a diagram illustrating an example of power supply voltages output from the power supply of FIG. 3 according to some exemplary embodiments.

Referring to FIGS. 1 to 4, the power supply 300 may include a second power supply voltage determiner (e.g., ELVSS determiner) 320, a delta voltage determiner (e.g. V_DELTA determiner) 340, and a third power supply voltage determiner (e.g., VINT1 determiner) 360. The power supply 300 may further generate the first power supply voltage ELVDD and the fourth power supply voltage VINT2 and apply the first power supply voltage ELVDD and the fourth power supply voltage VINT2 to the display panel 100.

The power supply 300 may receive data including the ambient temperature TEMP and the brightness DBV information to output the second power supply voltage ELVSS and the third power supply voltage VINT1.

The second power supply voltage determiner 320 may determine a voltage level of the second power supply voltage ELVSS based on the ambient temperature TEMP and the brightness DBV. The adjustment of the second power supply voltage ELVSS can reduce the power consumption and improve the color shift in response to the image change such as an abrupt brightness change. For example, as illustrated in FIG. 4, the second power supply voltage ELVSS may have a range of about −5V to about −2V depending on the ambient temperature TEMP and the brightness DBV. In FIG. 4, the ambient temperatures TEMP are provided below the column headers for the second power supply voltage ELVSS, a delta voltage V_D, the third power supply voltage VINT1, and a forward bias EL_bias of the organic light emitting diode EL. Further, the voltage values are provided in volts and the display brightness DBV are provided in nits (e.g., candela per square meter (cd/m$^2$)). The second power supply voltage determiner 320 may selectively output the voltage level of the second power supply voltage ELVSS in response to the ambient temperature TEMP and the brightness DBV.

In some exemplary embodiments, the second power supply voltage ELVSS may have a voltage level that is less than a middle brightness range between about 100 nit (e.g., 100 cd/m$^2$) and about 300 nit (e.g., 300 cd/m$^2$) to emit a high brightness image in a high brightness range of about 300 nit or more.

Further, in some exemplary embodiments, the second power supply voltage ELVSS at an ultralow brightness range of about 15 nit or less or a black image brightness may be set to be less than the voltage level in the middle brightness range. Accordingly, color blur (color shift) due to a rapid increase in brightness (or a rise in grayscale) from a black image to a white image may be improved (such as minimized).

In some exemplary embodiments, at the same brightness condition, the second power supply voltage ELVSS may be set to decrease as the ambient temperature TEMP decreases.

For example, as the ambient temperature TEMP decreases, the performance of the pixel (e.g., response speed, etc.) may decrease. Therefore, the forward bias EL_bias of the organic light emitting diode EL may be set to be increased as the ambient temperature TEMP decreases. However, this is an example, and the adjustment of the second power supply voltage ELVSS is not limited thereto. For example, when the display panel 100 emits light with a maximum brightness, the second power supply voltage ELVSS may have a constant value regardless of the change of the ambient temperature TEMP.

The second power supply voltage determiner 320 may adjust the second power supply voltage ELVSS in accordance with the operation mode of the organic light emitting display device 1000. For example, an amount of change in the second power supply voltage ELVSS according to the change in the brightness DBV and/or the ambient temperature TEMP in a low power driving mode may be less than the amount of change in the second power voltage ELVSS in a normal driving mode. The low power driving mode may be a mode for limiting the brightness (or the maximum brightness) of the display panel 100 to a predetermined brightness or lower. For example, the low power driving mode may include a night mode, an always on display mode, and/or the like.

The delta voltage determiner 340 may determine a delta voltage V_D, which is an offset to the second power supply voltage ELVSS based on the ambient temperature TEMP and the brightness DBV. The delta voltage V_D may be a value for determining the voltage level of the third power supply voltage VINT1. The third power supply voltage VINT1 may be determined by a difference between the delta voltage V_D and the second power supply voltage ELVSS. In some exemplary embodiments, as illustrated in FIG. 4, the delta voltage V_D may be in a range of about 0.5V to about 1.5V depending on the ambient temperature TEMP and the brightness DBV.

In some exemplary embodiments, at the same ambient temperature condition, the delta voltage V_D may decrease as the brightness DBV increases. Accordingly, at the same ambient temperature condition, the magnitude of the forward bias EL_bias applied to the organic light emitting diode EL may be reduced according to the increase of the brightness DBV. The forward bias EL_bias of the organic light emitting diode EL at the low brightness (and/or low grayscale) having a larger black margin may be greater than at the high brightness condition so that response characteristics, color blurring, and/or the like of the pixels 10 may be improved. As illustrated in FIG. 4, the forward bias EL_bias of the organic light emitting diode EL may also be in the range of about 0.5V to about 1.5V depending on the delta voltage V_D.

In some exemplary embodiments, at the same brightness condition, the delta voltage V_D may decrease as the ambient temperature TEMP increases. Accordingly, at the same brightness condition, the magnitude of the forward bias EL_bias applied to the organic light emitting diode EL can be reduced according to the increase of the ambient temperature TEMP. That is, the delta voltage V_D and the magnitude of the forward bias EL_bias applied to the organic light emitting diode EL may be selected in consideration of the response characteristic of the organic light emitting diode EL that changes according to the change of the ambient temperature TEMP.

Further, when the conditions are changed equally, the change rate of the delta voltage V_D and the change rate of the second power supply voltage ELVSS may be different from each other.

The third power supply voltage determiner 360 may determine the third power supply voltage VINT1 based on the second power supply voltage ELVSS and the delta voltage V_D. In some exemplary embodiments, the third power supply voltage VINT1 may be calculated as the sum of the second power supply voltage ELVSS and the delta voltage V_D. For example, the third power supply voltage determiner 360 may include an adder that receives the second power supply voltage ELVSS and the delta voltage V_D and outputs the third power supply voltage VINT1. The second power supply voltage ELVSS may be set to about −3.1 V and the delta voltage V_D may be set to about 0.5 V when the display panel 100 emits light of about 100 nit in an environment of 25° C. Thus, the third power supply voltage VINT1 may be set to about −2.6V by the sum of the second power supply voltage ELVSS and the delta voltage V_D.

In some exemplary embodiments, as illustrated in FIG. 4, the third power supply voltage VINT1 may be in a range of about −4.5V to about −2V depending on the ambient temperature TEMP and the brightness DBV. The third power supply voltage VINT1 may be determined by the delta voltage V_D, e.g., a predetermined bias of the organic light emitting diode EL. Therefore, the change rate of the third power supply voltage VINT1 due to the change of the ambient temperature TEMP and/or the brightness DBV may be different from the change rate of the second power supply voltage ELVSS.

In some exemplary embodiments, at the same ambient temperature condition, the third power supply voltage VINT1 may decrease to predetermined values as the brightness DBV increases. Further, in some exemplary embodiments, at the same brightness condition, the third power supply voltage VINT1 may increase to predetermined values as the ambient temperature TEMP increases. However, these are merely examples, and such a change in the third power supply voltage VINT1 may be applied only to a specific brightness condition or a specific temperature condition. For example, in the low brightness condition, the third power supply voltage VINT1 may decrease according to the increase of the ambient temperature TEMP in a range from about −20° C. to about 0° C., and then may increase according to the increase of the ambient temperature TEMP in a range from about 0° C. to about 20° C.

As described above, the power supply 300 according to various exemplary embodiments may individually adjust the second power supply voltage ELVSS and the third power supply voltage VINT1 so that a larger forward bias EL_bias is applied to the organic light emitting diode EL at a relatively low ambient temperature TEMP condition and/or a relatively low brightness DBV condition. Therefore, an optimum bias may be applied to the organic light emitting diode EL in response to the brightness DBV and ambient temperature TEMP changes of the display panel 100 without unnecessary power consumption. Thus, the color blur and color shift by the response speed deviation of the pixels 10 at the time of display image change may be improved. In addition, the forward bias EL_bias less than the threshold voltage of the organic light emitting diode EL may be stably applied to the organic light emitting diode EL at the low brightness DBV and the low grayscale so that defective display, such as black image brightness rise, may be improved.

Figure 5A:
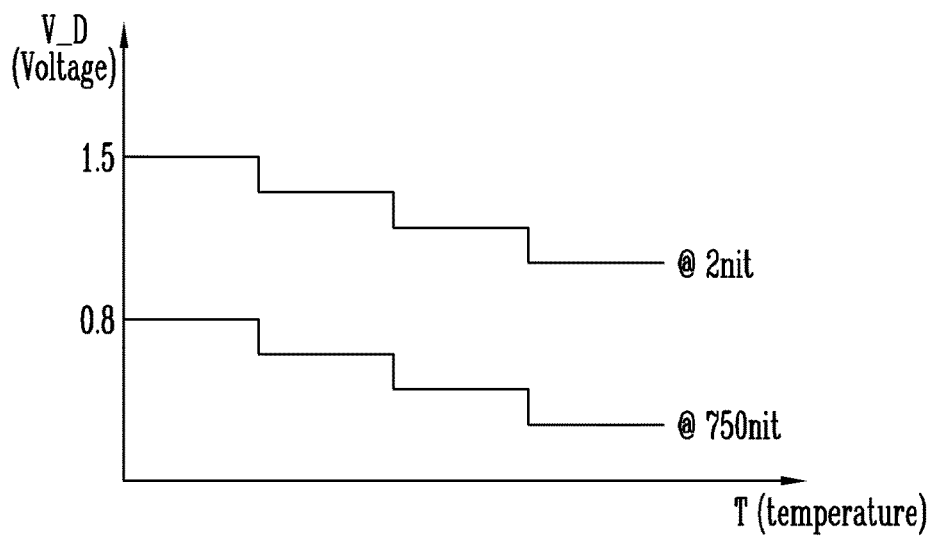
FIGS. 5A and 5B are graphs illustrating examples of a delta voltage determined by the power supply of FIG. 3 according to some exemplary embodiments.
Figure 5B:

FIGS. 5A and 5B are graphs illustrating examples of a delta voltage determined by the power supply of FIG. 3 according to some exemplary embodiments.

Referring to FIGS. 3 to 5B, the delta voltage V_D may change in response to the brightness DBV change and the ambient temperature TEMP change.

The delta voltage V_D may correspond to a voltage difference between the second power supply voltage ELVSS supplied to the cathode of the organic light emitting diode EL and the third power supply voltage VINT1 supplied to the anode of the organic light emitting diode EL during the non-emission period. In other words, the delta voltage V_D may correspond to a bias voltage EL_bias applied to the organic light emitting diode EL.

In some exemplary embodiments, the delta voltage V_D may vary in response to the ambient temperature TEMP change. For example, as illustrated in FIG. 5A, the voltage level of the delta voltage V_D may be set to decrease with a constant interval as the ambient temperature TEMP increases. That is, as the ambient temperature TEMP is lowered, the larger forward bias EL_bias may applied to the organic light emitting diode EL. This is because as the ambient temperature TEMP is lowered, the driving ability and the response speed of the organic light emitting diode EL composed of organic materials may be lowered. For example, the range of the ambient temperature TEMP may be set in a range of about −20° C. to about 30° C. However, this is merely an example, and a temperature range exceeding 30° C. may be added.

For example, when the display panel 100 emits at a brightness of about 750 nit and the ambient temperature TEMP is about −20° C., the delta voltage V_D may be determined to be about 0.8V. The delta voltage V_D may be decreased in steps as the ambient temperature TEMP increases. Since this is merely an example, the shape and rate of decrease of the delta voltage V_D are not limited thereto. For example, the decreasing graph of the delta voltage V_D with increasing ambient temperature TEMP may have a linear shape or a non-linear shape with an exponential function.

As illustrated in FIG. 5A, the delta voltage V_D for the relatively low brightness (or low grayscale) may be set to be greater than the delta voltage V_D for the relatively high brightness (or high grayscale) under the same ambient temperature TEMP condition. Since the black margin in the low brightness range is larger than the black margin in the high brightness (or luminance) range, the forward bias EL_bias for the low brightness range may be set to be greater than the forward bias EL_bias for the high brightness range. These settings may improve visual defects, such as color blur, color shift, and/or the like.

As illustrated in FIG. 5B, at the same ambient temperature TEMP condition, the delta voltage V_D may be set to be decreased to preset values as the brightness (or grayscale) increases. In particular, the degree of change of the delta voltage V_D in the low brightness range may be set to be larger than the degree of change of the delta voltage V_D in the middle brightness range and the high brightness range.

Accordingly, an optimal forward bias EL_bias may be applied to the organic light emitting diode EL in accordance with the brightness DBV and temperature TEMP changes of the display panel 100 without unnecessary power consumption, and the visual defects, such as the color blur and color shift, due to the response speed deviation of the pixel 10 may be improved.

Figure 6A:
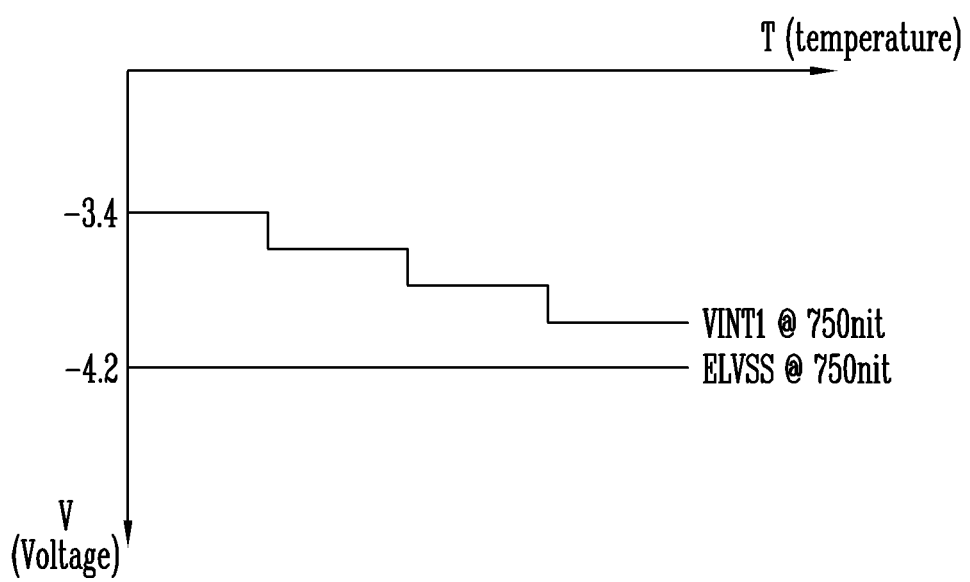
FIGS. 6A and 6B are graphs illustrating examples of a second power supply voltage and a third power supply voltage determined by the power supply of FIG. 3 according to some exemplary embodiments.
Figure 6B:
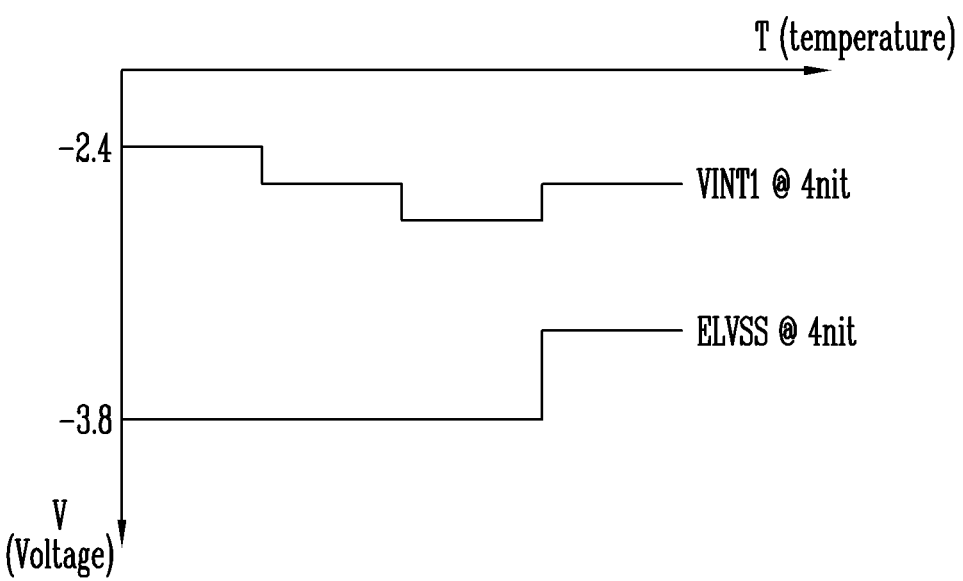

FIGS. 6A and 6B are graphs illustrating examples of a second power supply voltage and a third power supply voltage determined by the power supply of FIG. 3 according to some exemplary embodiments.

Referring to FIGS. 3 to 6B, the second power supply voltage ELVSS and the third power supply voltage VINT1 may change in response to the ambient temperature TEMP change at the same brightness DBV condition. The second power supply voltage ELVSS may be the common voltage supplied to the cathode of the organic light emitting diode EL for light emission. The third power supply voltage VINT1 may be a voltage for initializing the anode voltage of the organic light emitting diode EL before light emission.

As illustrated in FIG. 6A, the second power supply voltage ELVSS may maintain a constant value regardless of the change in the ambient temperature TEMP at the condition of the maximum luminance (e.g., 750 nit display brightness). In this case, the third power supply voltage VINT1 may be lowered as the ambient temperature TEMP increases. In some exemplary embodiments, the third power supply voltage VINT1 may be determined by the magnitude of the delta voltage V_D. For example, the difference between the second power supply voltage ELVSS and the third power supply voltage VINT1 may correspond to the magnitude of the delta voltage V_D and the forward bias EL_bias of the organic light emitting diode EL. That is, in the case of maximum brightness emission, the forward bias EL_bias of the organic light emitting diode EL may be decreased in steps as the ambient temperature TEMP increases.

In some exemplary embodiments, as illustrated in FIG. 6B, the second power supply voltage ELVSS may change once at a predetermined ambient temperature in the low brightness condition (for example, about 4 nit display brightness). For example, the second power supply voltage ELVSS may be set at about −3.6V at about 25° C. or higher, and may be set at about −3.8V at a temperature lower than 2° C. In this case, as illustrated in FIG. 6B, the third power supply voltage VINT1 may be expressed as a graph in which the voltage level decreases with an increase in the ambient temperature TEMP and then increases as the ambient temperature TEMP changes. The third power supply voltage VINT1 may be set corresponding to the delta voltage V_D (i.e., the bias voltage EL_bias of the organic light emitting diode EL) that is decreased with the increase in ambient temperature TEMP.

As described above, the voltage levels of the second power supply voltage ELVSS and the third power supply voltage VINT1 may be adjusted at different rates such that a larger forward bias EL_bias is applied to the organic light emitting diode EL as the ambient temperature TEMP decreases.

Figure 7A:
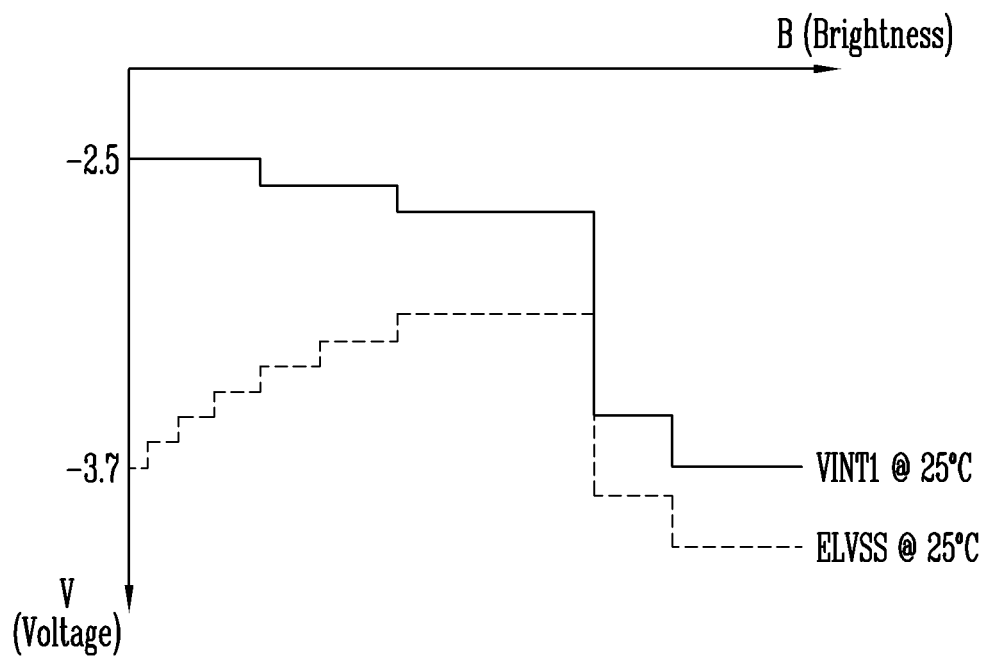
FIGS. 7A and 7B are graphs illustrating examples of a second power supply voltage and a third power supply voltage determined by the power supply of FIG. 3 according to some exemplary embodiments.
Figure 7B:
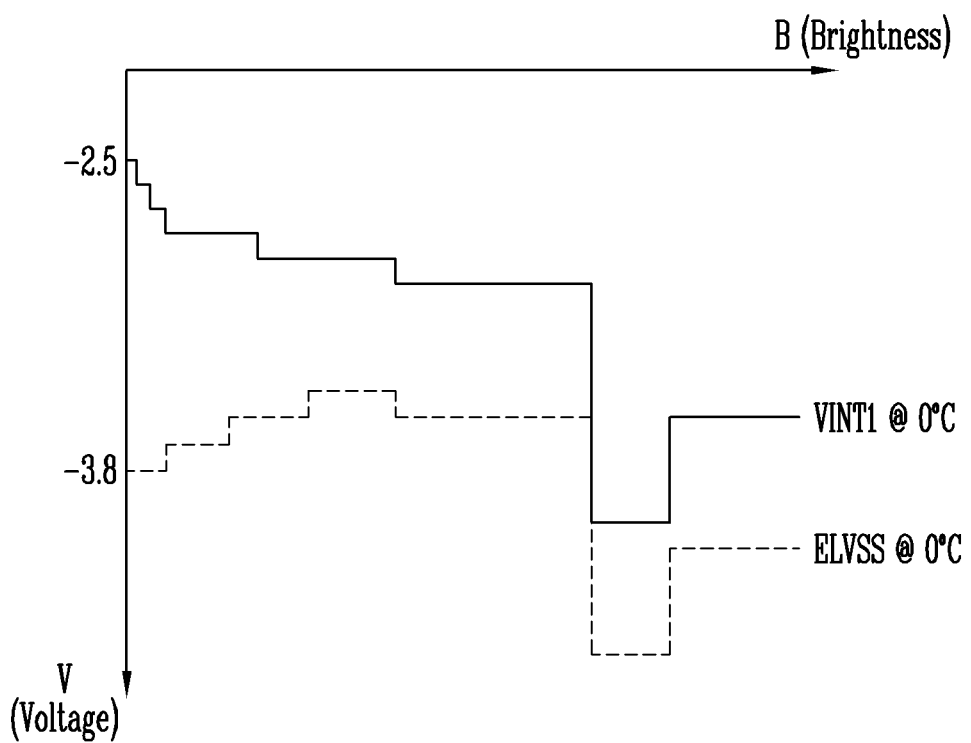

FIGS. 7A and 7B are graphs illustrating examples of a second power supply voltage and a third power supply voltage determined by the power supply of FIG. 3 according to some exemplary embodiments.

Referring to FIGS. 7A and 7B, the second power supply voltage ELVSS and the third power supply voltage VINT1 may change in response to the ambient temperature TEMP change at the same brightness DBV condition.

For example, as illustrated in FIG. 7A, the voltage level of the second power supply voltage ELVSS may increase with a dense interval in the low brightness range (e.g., in a range of about 0 nit to about 60 nit) at 25° C. condition. The voltage level of the second power supply voltage ELVSS may decrease with a larger interval in the high brightness range (e.g., the brightness of 300 nit or more) at 25° C. condition. The third power supply voltage VINT1 may be determined by the magnitude of the delta voltage V_D. Since the delta voltage V_D is set to decrease as the brightness increases, the third power supply voltage VINT1 may change according to the brightness change as shown in FIG. 7A.

FIG. 7B shows changes in the second power supply voltage ELVSS, the third power supply voltage VINT1, and the magnitude of the forward bias EL_bias (which may be equal to a difference between the second power supply voltage ELVSS and the third power supply voltage VINT1) of the organic light emitting diode EL according to the luminance change at 0° C. condition. Since the voltage changes due to the brightness DBV change are described above, a duplicate description will be omitted.

As described above, the voltage levels of the second power supply voltage ELVSS and the third power supply voltage VINT1 may be adjusted at different rates such that a larger forward bias EL_bias is applied to the organic light emitting diode EL as the brightness DBV is lowered.

Figure 8A:
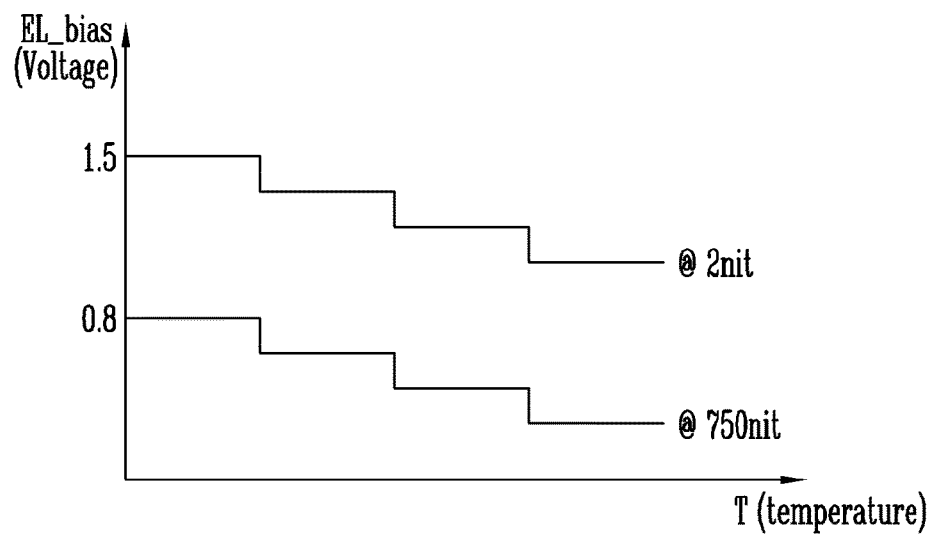
FIGS. 8A and 8B are graphs illustrating examples of bias of organic light emitting diodes included in the organic light emitting display device of FIG. 1 according to some exemplary embodiments.
Figure 8B:
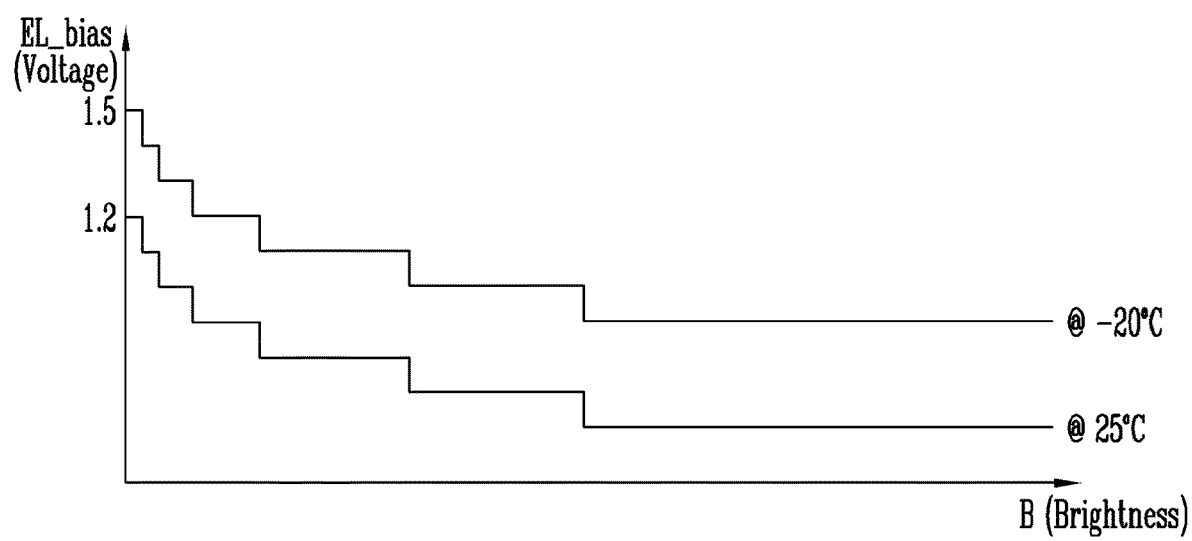

FIGS. 8A and 8B are graphs illustrating examples of bias of organic light emitting diodes included in the organic light emitting display device of FIG. 1 according to some exemplary embodiments.

Referring to FIGS. 5A to 8B, the magnitude of the forward bias EL_bias applied to the organic light emitting diode EL may be adjusted in response to the ambient temperature TEMP change at the same brightness DBV condition.

In some exemplary embodiments, the difference between the second power supply voltage ELVSS and the third power supply voltage VINT1 in FIGS. 6A and 6B may be expressed by the bias voltage graph of FIG. 8A. Thus, at the same brightness DBV condition, the magnitude of the forward bias EL_bias applied to the organic light emitting diode EL may decrease with a predetermined interval as the ambient temperature TEMP increases.

In addition, in some exemplary embodiments, the difference between the second power supply voltage ELVSS and the third power supply voltage VINT1 in FIGS. 7A and 7B may be expressed by the bias voltage graph of FIG. 8B. Thus, at the same ambient temperature TEMP condition, the magnitude of the forward bias EL_bias applied to the organic light emitting diode EL may decrease with a predetermined interval as the brightness DBV increases.

As described above, the organic light emitting display device 1000 according to various exemplary embodiments may individually adjust the second power supply voltage ELVSS and the third power supply voltage VINT1 in consideration of both the ambient temperature TEMP and the brightness DBV. Thus, an optimal forward bias EL_bias may be applied to the organic light emitting diode EL in response to the brightness DBV and ambient temperature TEMP changes of the display panel 100 without unnecessary power consumption, and the visual defects, such as the color blur and color shift, due to the response speed deviation of the pixel 10 may be improved. In addition, the forward bias EL_bias less than the threshold voltage of the organic light emitting diode EL may be stably applied to the organic light emitting diode EL at the low brightness and the low grayscale so that defective display, such as the black image brightness rise, may be improved.

Various exemplary embodiments may be applied to any display device and any electronic device including the display device. For example, various exemplary embodiments may be applied to a head-mounted display (HMD) device, a television, a computer monitor, a laptop, a digital camera, a cellular phone, a smart phone, a smart pad, a tablet computer, a personal digital assistant (PDA), a portable multimedia player (PMP), a MP3 player, a navigation system, a game console, a video phone, a billboard, etc.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An organic light emitting display device comprising:
   a display panel comprising pixels, each of the pixels comprising an organic light emitting diode configured to emit light in an emission period based on a first power supply voltage and a second power supply voltage;
   a display panel driver configured to apply a scan signal, an emission control signal, and a data signal to the pixels; and
   a power supply configured to:
      generate the first power supply voltage, the second power supply voltage, and a third power supply voltage applied to the pixels in a non-emission period;
      determine a delta voltage, which is an offset of the second power supply voltage, based on an ambient temperature and a display brightness of the display panel;
      adjust a voltage level of the second power supply voltage based on the ambient temperature and the display brightness of the display panel; and
      adjust a voltage level of the third power supply voltage based on the second power supply voltage and the delta voltage.

2. The organic light emitting display device of claim 1, wherein the power supply comprises:
   a second power supply voltage determiner configured to determine the voltage level of the second power supply voltage based on the ambient temperature and the display brightness;
   a delta voltage determiner configured to determine the delta voltage based on the ambient temperature and the display brightness; and
   a third power supply voltage determiner configured to determine the voltage level of the third power supply voltage based on the second power supply voltage and the delta voltage.

3. The organic light emitting display device of claim 2, wherein the third power supply voltage is determined as a sum of the second power supply voltage and the delta voltage.

4. The organic light emitting display device of claim 2, wherein, at a same ambient temperature condition, the delta voltage decreases as the display brightness increases.

5. The organic light emitting display device of claim 4, wherein, at a same display brightness condition, the delta voltage decreases as the ambient temperature increases.

6. The organic light emitting display device of claim 5, wherein the third power supply voltage is provided to an anode of the organic light emitting diode during the non-emission period to initialize an anode voltage of the organic light emitting diode.

7. The organic light emitting display device of claim 1, wherein:
   each of the pixels further comprises:
      a driving transistor coupled between a first node and a second node, the driving transistor comprising a gate electrode coupled to a third node; and
   the power supply is configured to generate a fourth power supply voltage applied to the gate electrode of the driving transistor.

8. The organic light emitting display device of claim 7, wherein the fourth power supply voltage has a constant value regardless of the ambient temperature and the display brightness.

9. The organic light emitting display device of claim 8, wherein a (j, k) pixel arranged in a j-th column and a k-th row of the pixels further comprises:
   a first transistor coupled between a j-th data line and the first node, the first transistor comprising a gate electrode configured to receive a k-th scan signal;
   a second transistor coupled between the second node and the third node, the second transistor comprising a gate electrode configured to receive the k-th scan signal;
   a third transistor coupled between a conductive line configured to transmit the fourth power supply voltage and the third node, the third transistor comprising a gate electrode configured to receive a (k−1)-th scan signal;
   a fourth transistor coupled between a power supply line configured to transmit the first power supply voltage and the first node, the fourth transistor comprising a gate electrode configured to receive a k-th emission control signal;
   a fifth transistor coupled between the second node and an anode of the organic light emitting diode, the fifth transistor comprising a gate electrode configured to receive the k-th emission control signal;
   a sixth transistor coupled between a conductive line configured to transmit the third power supply voltage and the anode of the organic light emitting diode, the sixth transistor comprising a gate electrode configured to receive the k-th scan signal; and
   a storage capacitor coupled between the power supply line and the third node.

10. The organic light emitting display device of claim 1, further comprising:
   a brightness calculator configured to determine the display brightness of the display panel based on image data of one frame; and
   a temperature sensor configured to detect the ambient temperature of the display panel.

11. The organic light emitting display device of claim 1, wherein, at a same ambient temperature condition, the third power supply voltage decreases to predetermined values as the display brightness increases.

12. The organic light emitting display device of claim 11, wherein, at a same display brightness condition, the third power supply voltage increases to predetermined values as the ambient temperature increases.

13. An organic light emitting display device comprising:
   a display panel comprising pixels, each of the pixels comprising an organic light emitting diode configured to emit light in an emission period based on a first power supply voltage and a second power supply voltage;

a display panel driver configured to apply a scan signal, an emission control signal, and a data signal to the pixels; and a power supply configured to:
  generate the first power supply voltage, the second power supply voltage, and a third power supply voltage applied to the pixels in a non-emission period; and
  adjust a voltage level of the second power supply voltage and a voltage level of the third power supply voltage based on an ambient temperature and a display brightness of the display panel,
  wherein, at a same ambient temperature condition, a delta voltage, which is a voltage difference between the second power supply voltage and the third power supply voltage, increases as the display brightness decreases.

14. The organic light emitting display device of claim 13, wherein, at a same display brightness condition, the delta voltage increases as the ambient temperature decreases.

15. The organic light emitting display device of claim 13, wherein a change rate of the second power supply voltage and a change rate of the third power supply voltage are different from each other in accordance with at least one of a change of the ambient temperature and a change of the display brightness.

16. An organic light emitting display device comprising:
a display panel comprising pixels, each of the pixels comprising:
  a driving transistor comprising a gate electrode; and
  an organic light emitting diode configured to emit light in an emission period based on a first power supply voltage and a second power supply voltage;

a display panel driver configured to apply a scan signal, an emission control signal, and a data signal to the pixels; and a power supply configured to:
  generate the first power supply voltage, the second power supply voltage, a third power supply voltage applied to the pixels in a non-emission period, and a fourth power supply voltage applied to the gate electrode of the driving transistor in the non-emission period; and
  adjust a delta voltage based on an ambient temperature and a display brightness of the display panel,
  wherein the delta voltage is a voltage difference between the second power supply voltage and the third power supply voltage, and
  wherein, at a same ambient temperature condition, the delta voltage decreases as the display brightness increases.

17. The organic light emitting display device of claim 16, wherein, at a same display brightness condition, the delta voltage decreases as the ambient temperature increases.

18. The organic light emitting display device of claim 16, wherein the fourth power supply voltage has a constant value regardless of the ambient temperature and the display brightness.

19. The organic light emitting display device of claim 16, wherein a change rate of the second power supply voltage and a change rate of the third power supply voltage are different from each other in accordance with at least one of a change of the ambient temperature and a change of the display brightness.

* * * * *